United States Patent
Freimann

(10) Patent No.: US 10,948,833 B2
(45) Date of Patent: Mar. 16, 2021

(54) WAFER HOLDING DEVICE AND PROJECTION MICROLITHOGRAPHY SYSTEM

(71) Applicant: Carl Zeiss SMT GmbH, Oberkochen (DE)

(72) Inventor: Rolf Freimann, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/823,790

(22) Filed: Mar. 19, 2020

(65) Prior Publication Data

US 2020/0218163 A1 Jul. 9, 2020

Related U.S. Application Data

(63) Continuation of application No. PCT/EP2018/075173, filed on Sep. 18, 2018.

(30) Foreign Application Priority Data

Sep. 20, 2017 (DE) ...................... 10 2017 216 679.7

(51) Int. Cl.
*G03F 7/20* (2006.01)

(52) U.S. Cl.
CPC .......... *G03F 7/706* (2013.01); *G03F 7/70308* (2013.01); *G03F 7/70666* (2013.01); *G03F 7/70725* (2013.01)

(58) Field of Classification Search
CPC .. G03F 7/70308; G03F 7/70591; G03F 7/706; G03F 7/70666; G03F 7/70716; G03F 7/70725

USPC ................ 355/52, 72; 356/520, 521
See application file for complete search history.

(56) References Cited

U.S. PATENT DOCUMENTS

| | | |
|---|---|---|
| 5,640,240 A | 6/1997 | Butler |
| 5,798,947 A | 8/1998 | Ye et al. |
| 6,573,997 B1* | 6/2003 | Goldberg ........... G01M 11/0264 356/515 |
| 6,753,534 B2 | 6/2004 | Novak et al. |
| 6,816,247 B1 | 11/2004 | Heppner et al. |
| 8,547,522 B2 | 10/2013 | Van De Kerkhof et al. |
| 9,046,794 B2 | 6/2015 | Hembacher et al. |
| 2002/0001088 A1 | 1/2002 | Wegmann et al. |
| 2005/0190377 A1* | 9/2005 | Ohkubo ................. G03F 7/706 356/515 |

(Continued)

FOREIGN PATENT DOCUMENTS

| | | |
|---|---|---|
| DE | 102011075371 A1 | 5/2012 |
| DE | 102011077223 A1 | 12/2012 |

(Continued)

OTHER PUBLICATIONS

Wojdyla et al., "Ptychographic wavefront sensor for high-NA EUV inspection and exposure tools", SPIE vol. 9048, 2014, 5 pages.

(Continued)

*Primary Examiner* — Colin W Kreutzer
(74) *Attorney, Agent, or Firm* — Edell, Shapiro & Finnan, LLC

(57) ABSTRACT

A wafer holding device (200, 415) is configured to hold a wafer (205, 416) during operation of a microlithographic projection exposure apparatus and includes at least one sensor that is positionable in different rotational positions.

16 Claims, 7 Drawing Sheets

(56) References Cited

U.S. PATENT DOCUMENTS

| | | | |
|---|---|---|---|
| 2007/0146688 A1 | 6/2007 | Tezuka | |
| 2008/0144043 A1 | 6/2008 | Wegmann et al. | |
| 2010/0086865 A1* | 4/2010 | Shiraishi | G03F 9/7034 430/30 |
| 2011/0008734 A1 | 1/2011 | Ichinose | |
| 2012/0307258 A1 | 12/2012 | Koerner et al. | |
| 2014/0118712 A1 | 5/2014 | Goeppert et al. | |
| 2015/0009492 A1 | 1/2015 | Frese et al. | |
| 2018/0196350 A1 | 7/2018 | Bieling et al. | |
| 2018/0299782 A1 | 10/2018 | Wegmann | |
| 2019/0187564 A1 | 6/2019 | Samaniego | |
| 2019/0212226 A1 | 7/2019 | Wegmann | |

FOREIGN PATENT DOCUMENTS

| | | |
|---|---|---|
| DE | 102012204704 A1 | 9/2013 |
| DE | 102015226571 A1 | 6/2017 |
| DE | 102016212462 A1 | 1/2018 |
| DE | 102016212477 A1 | 1/2018 |
| DE | 102016215543 A1 | 2/2018 |
| DE | 102017200935 A1 | 7/2018 |
| EP | 1679737 A1 | 7/2006 |
| EP | 2853943 B1 | 11/2016 |
| WO | 0163233 A2 | 8/2001 |
| WO | 2011089010 | 7/2011 |
| WO | 2016169890 A1 | 10/2016 |
| WO | 2016179926 A1 | 11/2016 |

OTHER PUBLICATIONS

International Search Report, PCT/EP2018/075173, dated Dec. 11, 2018, 6 pages.

Wojdyla et al., "Ptychographic wavefront sensor for high-NA EUV inspection and exposure tools", Visual Communications and Image Processing; Jan. 1, 2004, 5 pages.

GPTO Office Action with English translation, DE 102017216679.7, dated May 29, 2018, 8 pages.

International Preliminary Report on Patentability, PCT/EP2018/075173, dated Mar. 24, 2020, 15 pages.

* cited by examiner

WAFER HOLDING DEVICE AND PROJECTION MICROLITHOGRAPHY SYSTEM

CROSS REFERENCE TO RELATED APPLICATIONS

This is a Continuation of International Application PCT/EP2018/075173, which has an international filing date of Sep. 18, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 216 679.7 filed on Sep. 20, 2017.

FIELD OF THE INVENTION

The invention relates to a wafer holding device for holding a wafer during the operation of a microlithographic projection exposure apparatus, and a microlithographic projection exposure apparatus.

BACKGROUND

Microlithography is used for production of microstructured components, for example integrated circuits or LCDs. The microlithography process is conducted in what is called a projection exposure apparatus, which comprises an illumination device and a projection lens. The image of a mask (=reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In practice, there is a need to determine a distortion and a wavefront aberration of the projection lens as exactly as possible.

In particular, the technique of moiré measurement is known for measuring the distortion, which technique includes projecting a first grating arranged in an object plane of the projection lens onto a second grating (also referred to as "moiré mask") arranged in the image plane of the projection lens and the measurement of the light intensity respectively transmitted through this arrangement using an (e.g. camera-based) detector arrangement. Here, in practice, there is also the need for a moiré measurement of so-called anamorphic imaging systems. Here, anamorphic imaging is understood to mean imaging which produces a distorted image of the object and which is not an instance of similarity transform (i.e., which is not representable by a combination of displacement, rotation, mirroring and scaling). In a special case, such an anamorphic imaging system may be e.g. a projection lens which has different imaging scales along two mutually different axes.

Wavefront aberrations of the projection lens can be determined using shearing interferometry. Here, a measurement mask, which takes the form of a two-dimensional shearing grating and is disposed in the object plane of the projection lens to be measured, and a diffraction grating, which is disposed in the image plane of the projection lens, are matched to one another in such a way that, when the measurement mask is imaged on the diffraction grating, a superposition pattern in the form of an interferogram arises, which is captured and evaluated using a spatially resolving detector.

A problem that arises in practice when determining the distortion and determining wavefront aberrations of the projection lens is that the absolute precision of known measuring arrangements, which comprise, e.g., a sensor arrangement that is displaceable into the region of the wafer stage, is not sufficient. As a result, the manufacturing errors arising from the employed measurement technology result directly in measurement errors. In particular, the measurement signals obtained in the aforementioned moiré measurement are also influenced by manufacturing errors of the first grating, which contains the test structures, and/or of the second grating, which forms the moiré mask, resulting in a need for appropriate calibration.

In order to overcome this problem, the practice of carrying out a so-called calibration method is known, in which—as indicated in FIG. 6—the test object or projection lens 606 is measured in a plurality of different measurement positions which differ from one another in respect of the positioning of the test object relative to the measurement system or the grating arrangement made of first grating 605 and second grating 608. In principle, this facilitates a separation of the respective components of the test object from the components of the measurement system in the obtained measurement signals or in the evaluation result obtained in the detection plane. However, a problem arising here when measuring the aforementioned anamorphic imaging systems is that, in the different measurement positions brought about during the calibration, there is no longer an originally present fit or correspondence between the moiré mask and these test structures in specific measurement positions (which, e.g., are brought about by rotations) as a consequence of the distorted imaging of the test structures. This has the consequence that a correct evaluation of the measurement signals becomes difficult or even impossible, and the aforementioned calibration method is no longer applicable.

A further problem arising in practice is that the optical imaging properties of a projection exposure apparatus are subject to changes over time due to drift effects, radiation-related heating and deformation of the optical components (in particular mirrors) accompanying this, and also due to changes in existing layers as a result of contamination or layer ablation. This has the consequence that the aforementioned distortion and wavefront aberrations of the projection lens change over the service life of the projection exposure apparatus.

In respect of the prior art, reference is made, purely by way of example, to WO 01/63233 A2, U.S. Pat. No. 8,547,522 B2, U.S. Pat. No. 6,753,534 B2, US 2011/0008734 A1, WO 2016/169890 A1, U.S. Pat. Nos. 5,640,240 and 5,798,947.

SUMMARY

Against the aforementioned background, it is an object of the present invention to provide a wafer holding device for holding a wafer during the operation of a microlithographic projection exposure apparatus and a microlithographic projection exposure apparatus, which facilitate a measurement of distortion and/or wavefront aberrations with increased accuracy, preferably also in anamorphic imaging systems, while at least partially also avoiding the above-described problems.

This object is achieved by the wafer holding device and the microlithographic projection exposure apparatus, respectively, according to the features of the alternative independent patent claims.

According to one aspect, the invention relates to a wafer holding device for holding a wafer during the operation of a microlithographic projection exposure apparatus, comprising at least one sensor that is positionable in different rotational positions.

According to one embodiment, the at least one sensor comprises at least one line grating for distortion measurements.

According to one embodiment, the at least one sensor comprises at least one two-dimensional shearing grating for wavefront measurements.

According to one embodiment, the at least one sensor comprises at least one ptychography mask. In addition to or instead of a shearing grating (comprising a line pattern), a complex shaped grating can be used to produce a complex interferogram here in order to enable a lower-noise conclusion to be drawn about the wavefront. In this context, reference is made to the publication A. Wojdyla et al.: "Ptychographic wavefront sensor for high-NA EUV inspection and exposure tools", Proc. of SPIE Vol. 9048, 904839 (2014) doi: 10.1117/12.2048386.

According to one embodiment, the at least one sensor comprises at least one areally measuring intensity detector.

According to a further aspect, the invention relates to a microlithographic projection exposure apparatus comprising an illumination device and a projection lens, wherein the illumination device is designed to illuminate a mask during operation of the projection exposure apparatus, said mask comprising structures to be imaged and being disposed in an object plane of the projection lens;

wherein the projection lens is designed to image this object plane onto an image plane; and wherein the projection exposure apparatus comprises a wafer holding device having the features described above.

According to one embodiment, a rotary stage that is displaceable in the image plane in translational fashion is disposed on the wafer holding device, the at least one sensor being positionable in different rotational positions in the beam path by way of said rotary stage.

The invention further also relates to a microlithographic projection exposure apparatus comprising an illumination device and a projection lens, wherein the illumination device is designed to illuminate a mask during operation of the projection exposure apparatus, said mask comprising structures to be imaged and being disposed in an object plane of the projection lens, wherein the projection lens is designed to image this object plane onto an image plane;

wherein at least one rotary stage that is displaceable in the image plane in translational fashion is provided, a sensor group being positionable in different rotational positions in the beam path by way of said rotary stage; and wherein the at least one rotary stage that is displaceable in the image plane in translational fashion is disposed on a wafer holding device provided for holding a wafer.

The direct attachment of the rotary stage according to the invention to the wafer holding device has the advantage of allowing the wavefront and/or distortion measurement to be carried out comparatively quickly or frequently.

In particular, the invention includes the concept of realizing a cascade (in the sense of a series connection or link) of a "displacement stage", to facilitate a translational displacement, and a rotary stage (to facilitate rotation) in the projection exposure apparatus. In this case, a respective structure-based measurement mask suitable for a specific system measurement technique (in particular for wavefront or distortion measurement) can be placed in the beam path instead of the actual (lithography) mask. At the same time, a suitable detector and evaluation unit (e.g. a moiré grating for distortion measurement or a two-dimensional shearing grating for wavefront measurement, in conjunction with a detector, for example in the form of a CCD camera) can be placed in the image plane instead of the wafer. Here, the incident light is structured in a targeted manner by way of the measurement mask, this structure is imaged on the detector and the imaged structure is observed accordingly.

The construction of a projection exposure apparatus according to the invention can take into account the fact that, in practice, the optical imaging properties of the projection exposure apparatus are subject to temporal variations due to drift effects, radiation-related heating and, accompanying this, deformation of the optical components (in particular mirrors) and changes in existing layers due to contamination or layer ablation. In order to take the resulting wavefront aberrations and, where appropriate, distortion effects into account, the respective wavefront and/or distortion measurement can be performed repeatedly over the life of the projection exposure apparatus.

The rotation realizable in the design according to the invention further facilitates, in particular, a calibration of non-rotationally symmetric errors of the measurement system during a wavefront measurement. Here, the invention allows the measurement of additional directionally dependent, non-rotationally symmetric terms or modes in the wavefront with increased accuracy. This facilitates calibration methods which, in addition to a displacement for calibrating directionally dependent wavefront errors, include a rotation of the employed measurement mask and/or the employed sensor arrangement.

Moreover, the rotation according to the invention facilitates a practical implementation, described in more detail below, of a calibration method that takes into account a correct and possible manufacturing error of the measurement system, even in a projection exposure apparatus with an anamorphic imaging system.

According to one embodiment, moreover, a further rotary stage that is displaceable in the object plane in translational fashion is provided, a measurement mask comprising at least one measuring structure being positionable in different rotational positions in the beam path instead of the mask by way of said further rotary stage.

According to one embodiment, the further rotary stage is disposed on a mask holding device provided for holding the mask. The direct attachment of this further rotary stage to the mask holding device has the advantage of allowing the wavefront and/or distortion measurement to be carried out comparatively quickly or frequently.

According to one embodiment, the further rotary stage is arranged on a translationally displaceable holding device that is separate from a mask holding device provided for holding the mask. This configuration has the advantage of rendering comparatively high accuracies obtainable in the wavefront or distortion measurement.

According to one embodiment, the measurement mask comprises at least one line grating for distortion measurements.

According to one embodiment, the measurement mask comprises at least one two-dimensional shearing grating for wavefront measurements.

According to one embodiment, the measurement mask comprises at least one pinhole for ptychography.

According to one embodiment, the projection lens is an anamorphic imaging system.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIGS. 1-4 show schematic illustrations for explaining different embodiments of the present invention, where FIG. 1 shows an embodiment with rotary stages on a linearly displaceable holding device that is separate from the wafer holding device, FIG. 3 shows an embodiment with a rotary stage on an areally displaceable holding device.

DETAILED DESCRIPTION

Figure 4A:
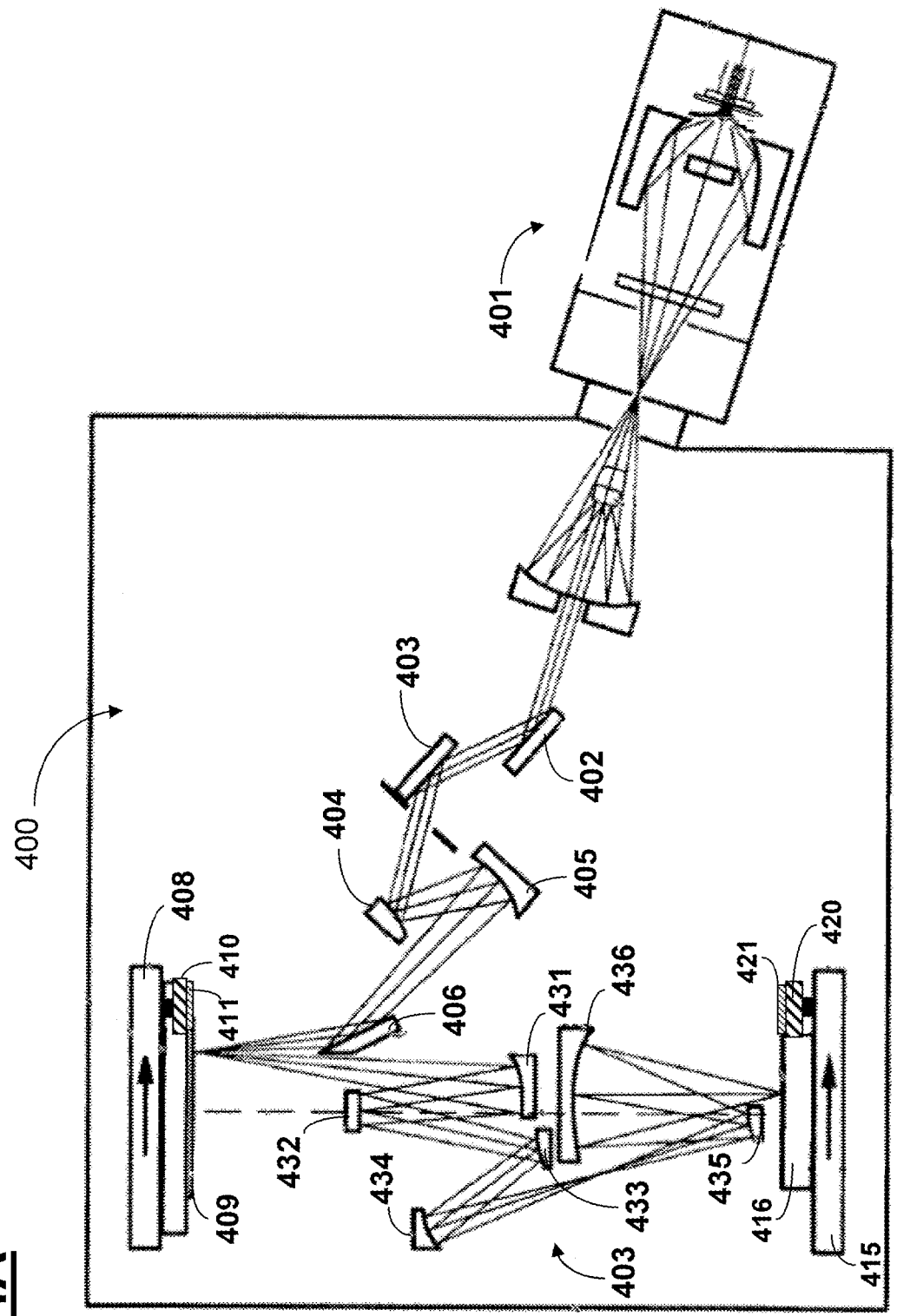
FIG. 4A shows an exemplary embodiment of a microlithographic projection exposure apparatus.

FIG. 4A shows, purely in schematic representation, the possible design of a microlithographic projection exposure apparatus according to the invention. The projection exposure apparatus 400 designed for EUV comprises an illumination device and a projection lens. The illumination device comprises a field facet mirror 402 and a pupil facet mirror 403. The light from a light source unit 401 comprising a plasma light source and a collector mirror is steered onto the field facet mirror 402. A first telescope mirror 404 and a second telescope mirror 405 are arranged in the light path downstream of the pupil facet mirror 403. A deflection mirror 406 is arranged downstream in the light path, said deflection mirror directing the radiation that is incident thereon onto an object field in the object plane of a projection lens comprising six mirrors 431-436. A reflective structure-bearing mask 409 is disposed on a mask stage or a mask holding device 408 at the location of the object field, wherein the mask 409 is imaged into an image plane with the aid of the projection lens, a substrate 416 coated with a light-sensitive layer (photoresist) being located on a wafer stage or a wafer holding device 415 in said image plane.

According to FIG. 4A, the projection exposure apparatus 400 comprises a first rotary stage 410 that is displaceable in the object plane in translational fashion. Instead of the actual (lithography) mask 409, a measurement mask 411 is positionable in different rotational positions in the beam path by way of this first rotary stage 410.

Figure 4B:
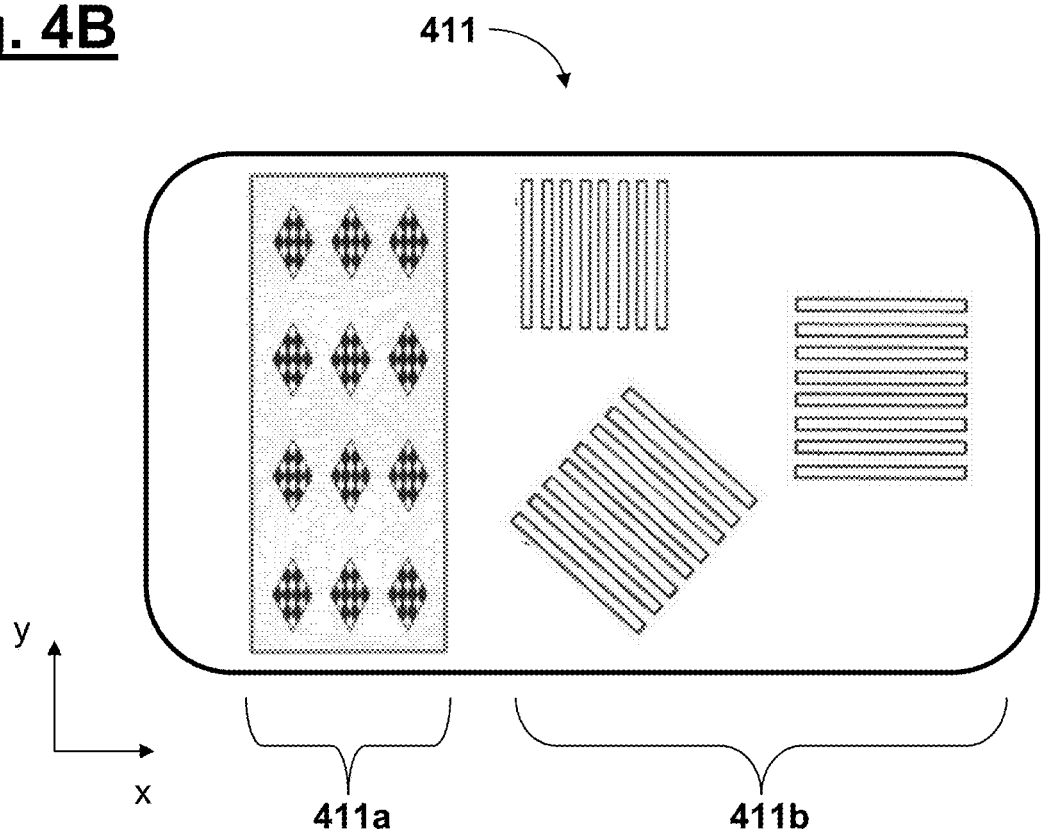
FIG. 4B shows a measurement mask for the exemplary embodiment depicted in FIG. 4A.

As indicated schematically in FIG. 4B, the measurement mask 411 of the exemplary embodiment comprises structures that are different from one another and serve different purposes. Here, the structures labeled "411a" serve for (field point resolved) wavefront measurements, and the structures labeled "411b" serve for distortion measurements. Although it is advantageous to house the aforementioned measurement structures in order to avoid changing the measurement mask 411, the invention is not restricted thereto. Thus, in further embodiments, use could also be made of one or more measurement masks, each with only one measurement structure or else with a plurality of measurement structures that respectively serve only for wavefront measurements or only for distortion measurements.

Moreover, the projection exposure apparatus according to FIG. 4A comprises a rotary stage 420 that is displaceable in the image plane of the projection lens in translational fashion, with which rotary stage a sensor group is positionable in different rotational positions in the beam path instead of the wafer. According to the schematic illustration in FIG. 4C, this sensor group comprises both sensors for wavefront measurements (group 421a) and sensors for distortion measurements (group 421b).

Figure 4C:
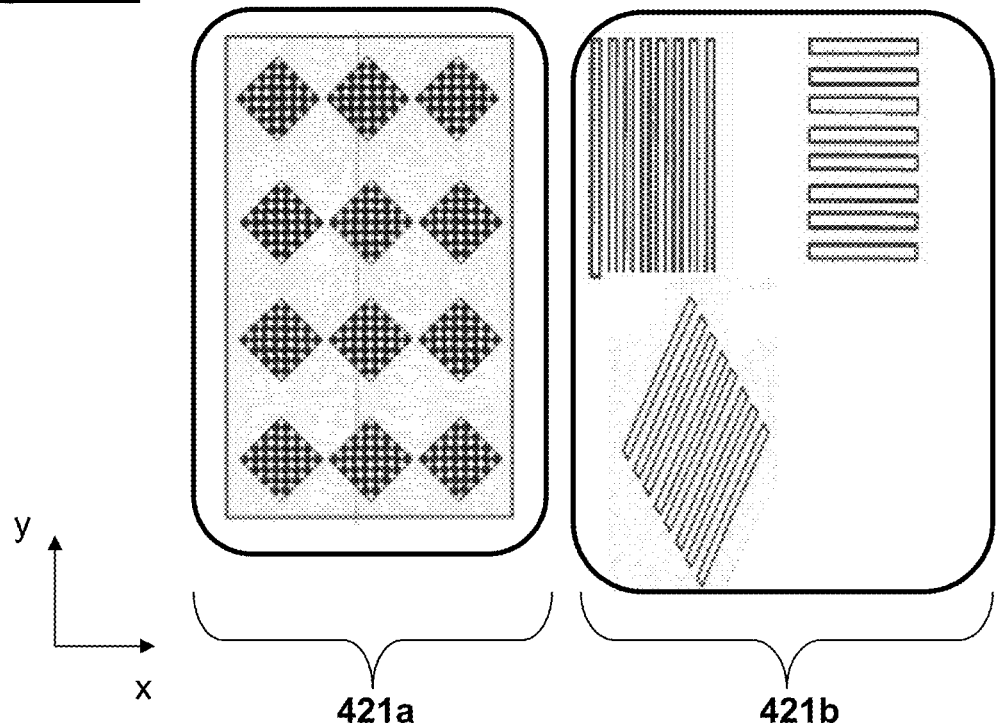
FIG. 4C shows two separate sensor groups for respective measurement masks.

In the exemplary embodiment of FIGS. 4A-4C, the first rotary stage 410 is disposed on the mask stage or a mask holding device 408 provided for holding the mask 409, and the second rotary stage 420 is arranged on the wafer stage or a wafer holding device 415 provided for holding a wafer 416. In further embodiments of the disclosure, the first rotary stage 410 and the second rotary stage 420 can also each be disposed on a translationally displaceable holding device that is separate from the mask holding device 408 and wafer holding device 415.

Figure 1:
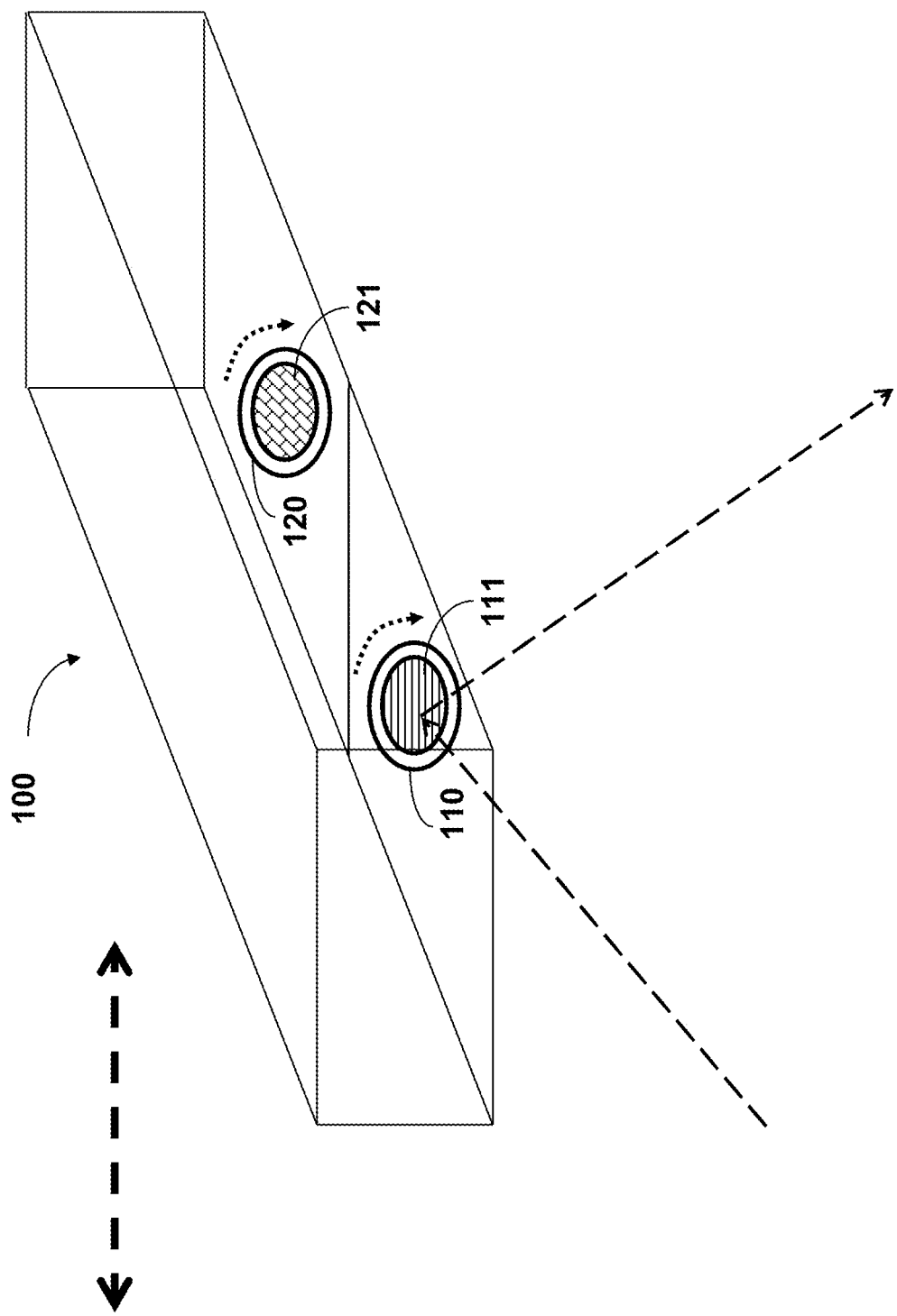

FIG. 1 shows, in a further schematic illustration, an embodiment according to the invention, with rotary stages 110, 120 being provided in this case on a translationally displaceable (in the arrow direction) holding device 100 that is separate from the mask holding device, of which one rotary stage 110 comprises a measurement mask 111 with a line grating for distortion measurements and the other rotary stage 120 comprises a measuring mask 121 with a two-dimensional shearing grating for wavefront measurements.

Figure 2A:
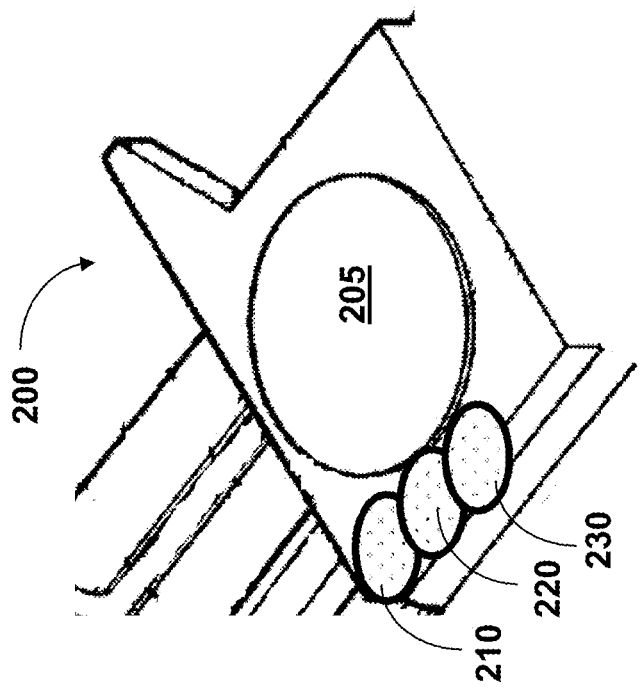
FIG. 2A shows rotary stages on a wafer holding device.
Figure 2B:
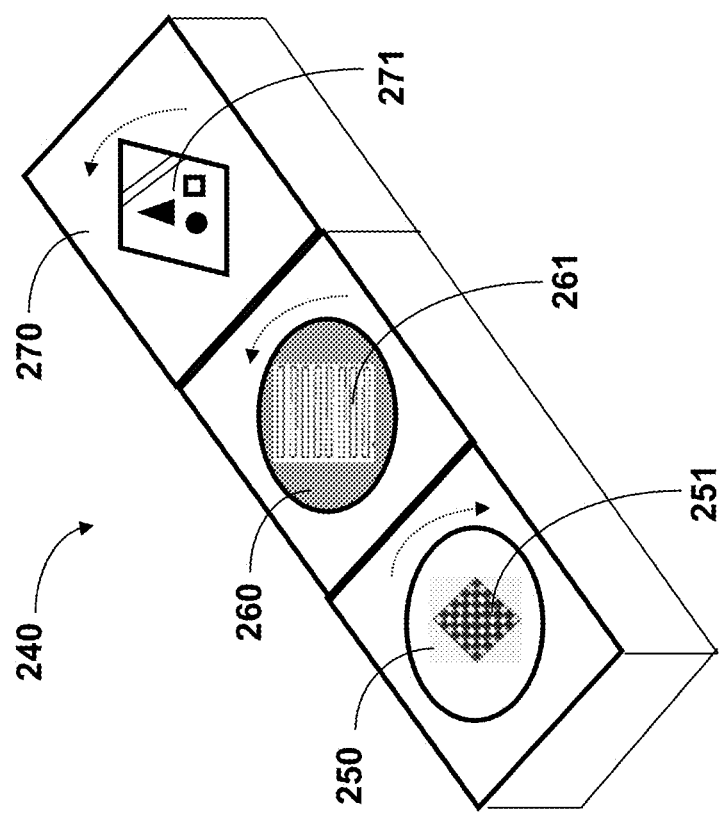
FIG. 2B shows rotary stages on a holding device that is separate from the wafer holding device.

FIGS. 2A-2B show further schematic illustrations of possible embodiments of a sensor group that, according to the invention, is positionable in the image plane in place of the wafer.

According to FIG. 2A, rotary stages 210, 220 and 230 are located on a wafer holding device 200 provided for holding a wafer 205, wherein each of the rotary stages 210-230 can be equipped with a suitable sensor group for distortion or wavefront measurements. FIG. 2B shows a possible embodiment with a translationally displaceable holding device 240 that is separate from the wafer holding device and on which rotary stages 250, 260 and 270 are disposed, wherein a two-dimensional shearing grating 251 for wavefront measurements is provided on the rotary stage 250, a line grating is provided on the rotary stage 260 for distortion measurements and a ptychography mask 271 is provided on the rotary stage 270.

Figure 3:
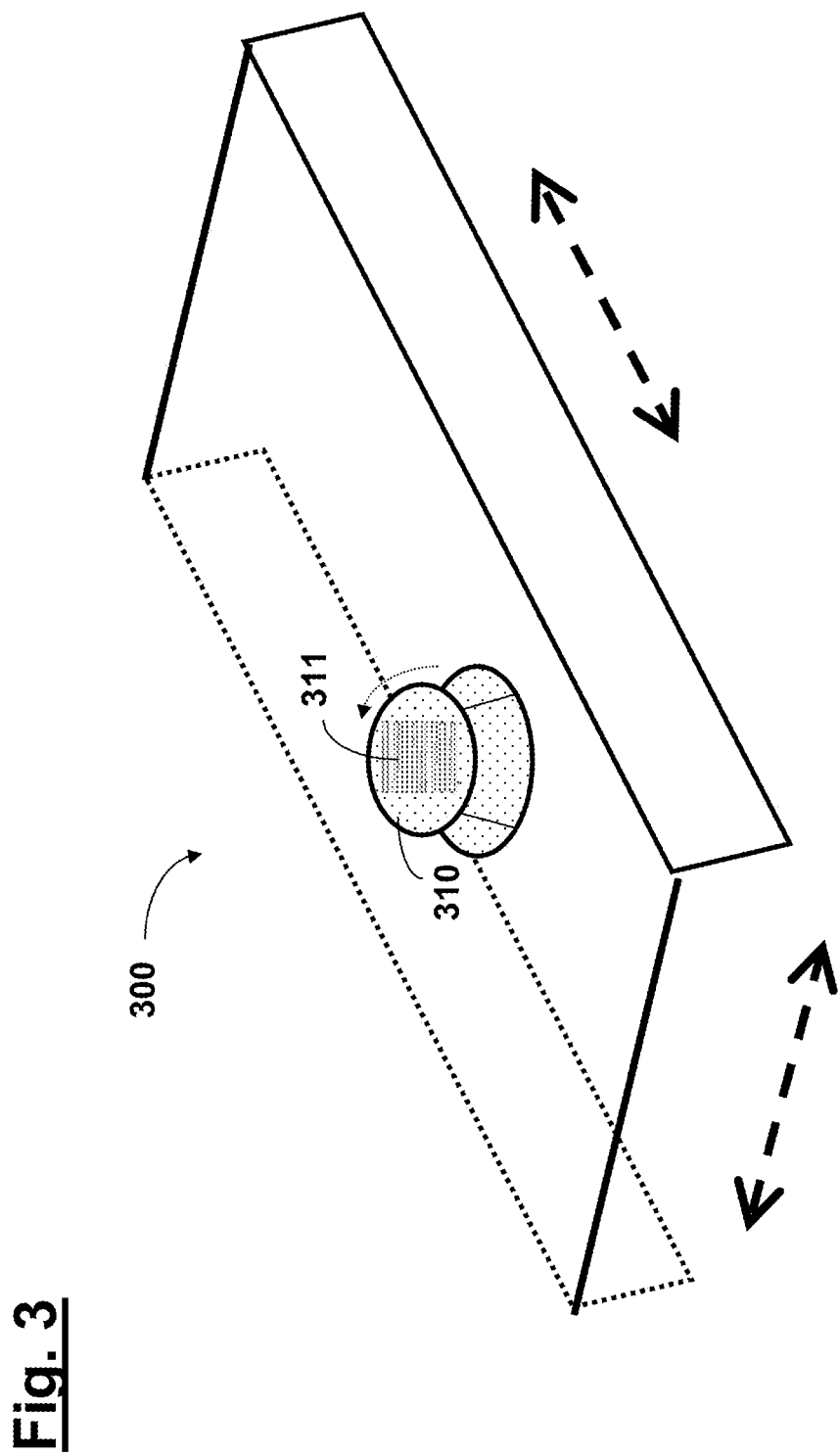

FIG. 3 shows, purely schematically, a further illustration of a holding device 300 that is translationally displaceable in two mutually perpendicular directions within the image plane, in accordance with the double arrows shown, wherein a rotary stage 310 is disposed on this holding device 300, a line grating 311 for distortion measurements being provided on said rotary stage.

The design of an apparatus for the moiré measurement of a test object and the implementation of a calibration method are explained below with reference to FIG. 5 as an exemplary application of the invention.

Figure 5:
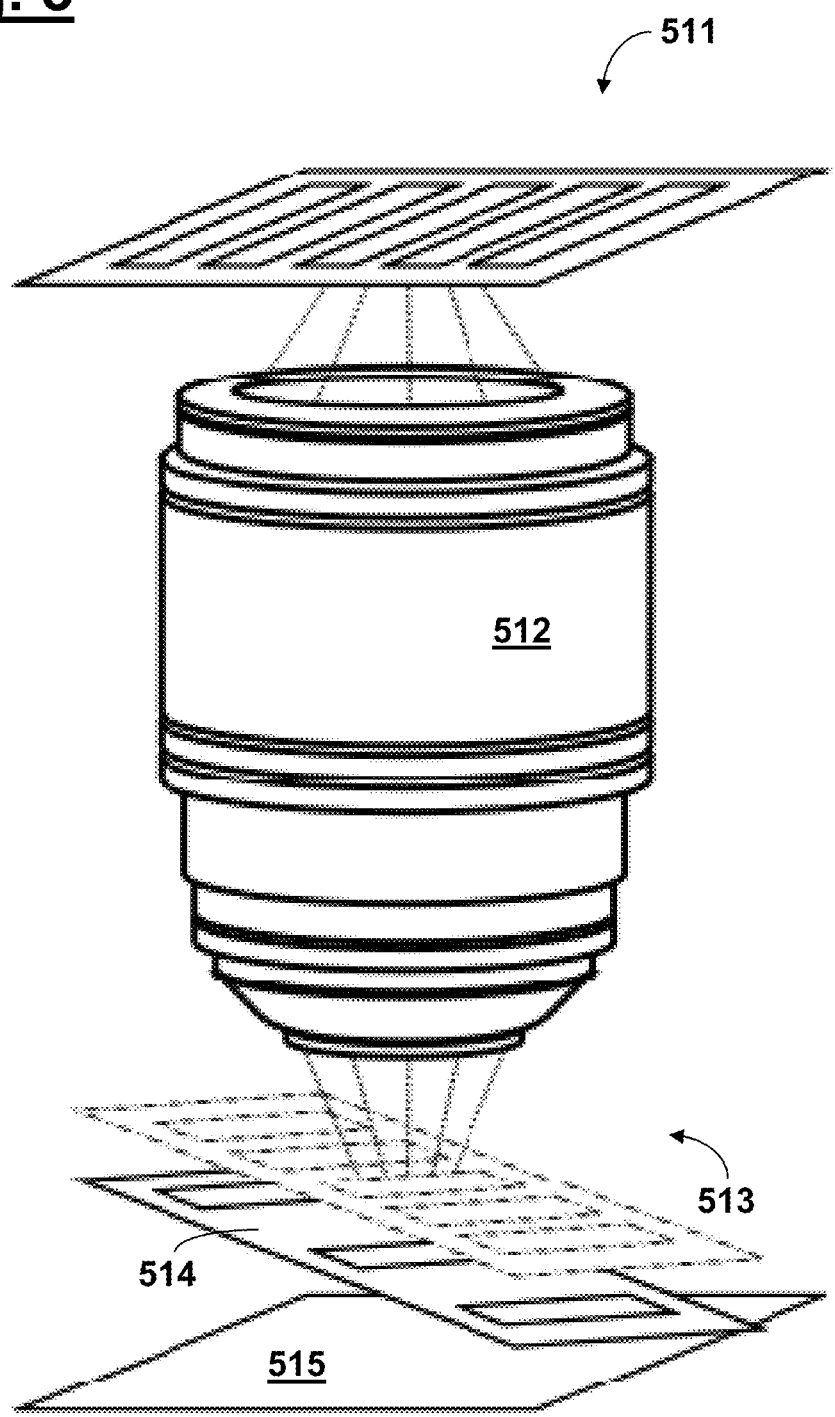
FIG. 5 shows a schematic illustration for explaining the implementation of a calibration method in an apparatus for a moiré measurement of a test object as an exemplary application of the present invention.

According to FIG. 5, an apparatus for the moiré measurement of an optical test object 512 or projection lens comprises a grating arrangement made of a first grating 511, which is positionable in the optical beam path upstream of the test object 512 and which comprises test structures to be imaged, and a second grating 514, which is positionable in the optical beam path downstream of the test object 512, and an evaluation unit comprising at least one detector 515, for evaluating moiré structures produced by superposition of the two gratings in a detection plane situated downstream of the second grating 514 in the optical beam path. The produced image of the test structures contained in the first grating 511 is denoted by "513". As a rule, the planes of, firstly, the test structure image 513 and of, secondly, the second grating 514 or of the moiré mask are coincident and are depicted with spatial separation only for the purposes of better illustration. Furthermore, the detector 515 should also follow as closely as possible in the optical beam path downstream of the image plane in which the test structure image 513 is produced.

Figure 6:
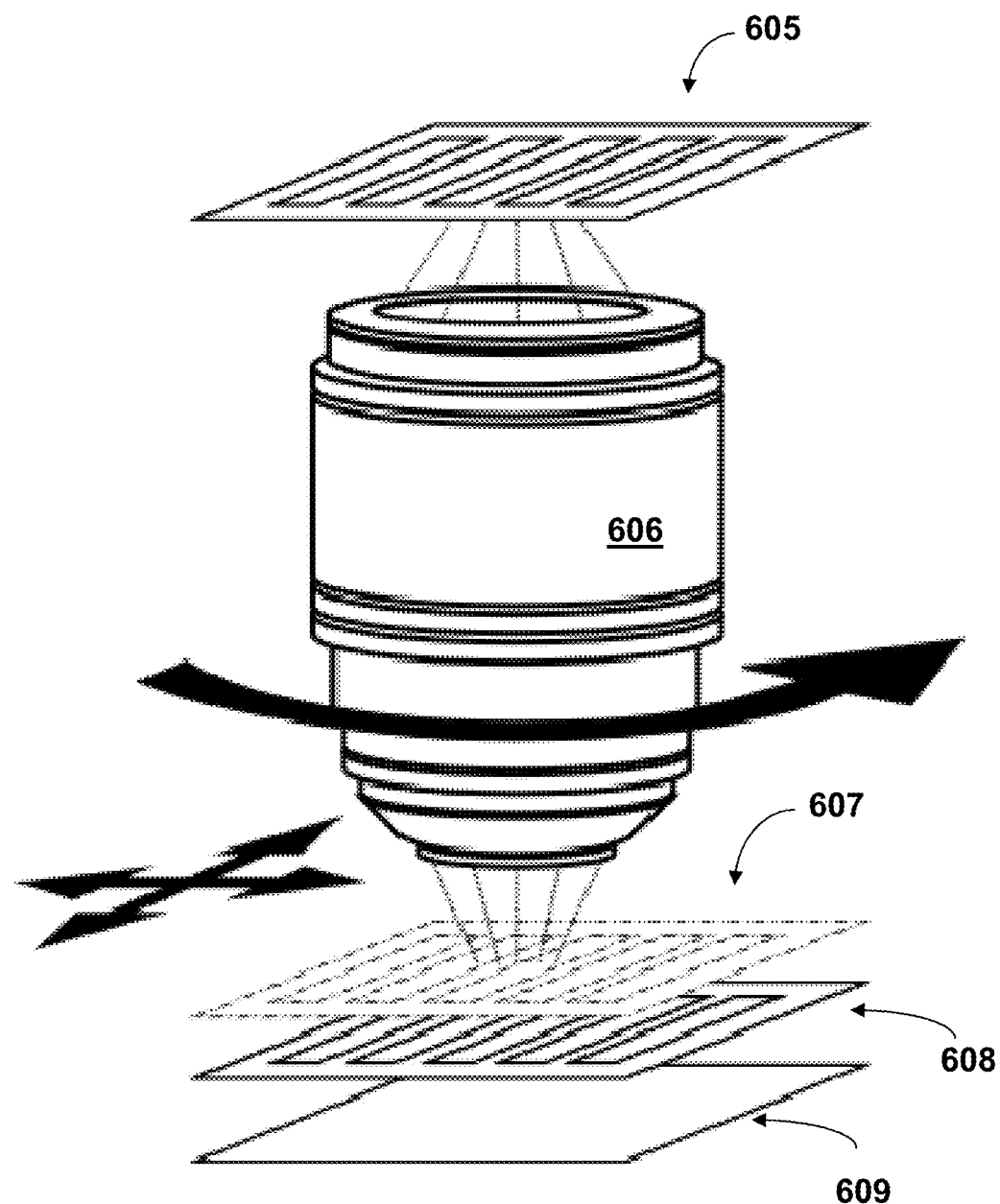
FIG. 6 shows a schematic illustration for explaining the implementation of a calibration method in an apparatus for a moiré measurement of a test object according to the prior art.

The grating arrangement made of the first grating 511 and the second grating 514 (i.e., the moiré mask) can now be designed in such a way that, in each case in combination with an anamorphic test object or projection lens to be measured, the calibration method described at the outset on the basis of FIG. 6 is facilitated; i.e., a correct moiré measurement or evaluation of the signals obtained here is possible in a plurality of rotational and/or displacement positions between, firstly, the measurement arrangement comprising said grating arrangement and, secondly, the test object 512. In each case, this can be achieved by virtue of the first grating 511 and the second grating 514 being matched to one another in such a way that an evaluation result is obtained in the detection plane, the light intensity transmitted through the grating arrangement being at a maximum in the case of aberration-free imaging by the test object 512 and being reduced in the case of present imaging aberrations of the test object 512 in said evaluation result for at least two measurement positions (which are selectable for calibration purposes) which differ in respect of the relative position of grating arrangement and test object 512. To this end, the respective grating periods of the first grating 511 and of the second grating 514 are chosen in such a way that the grating period of the second grating 514 corresponds to a common multiple or a common divisor of the respective periods of two test structure images of the test structures of the first grating 511 produced by the imaging system in two different measurement positions. To this end, different rotational and/or displacement positions can be set between, firstly, the measuring arrangement comprising said grating arrangement and, secondly, the test object, which can be implemented in the projection exposure apparatus according to the invention using the above-described translationally displaceable rotary stages.

Here, the calibration method described at the outset is facilitated even in the case of anamorphic imaging by the test object, by virtue of a moiré measurement or evaluation of the signals obtained in the process being carried out in a plurality of rotation and/or displacement positions between, firstly, the measurement arrangement comprising said grating arrangement and, secondly, the test object.

Although the invention has been described with reference to specific embodiments, numerous variations and alternative embodiments will be apparent to the person skilled in the art, for example through combination and/or exchange of features of individual embodiments. Accordingly, such variations and alternative embodiments are also encompassed by the present invention, and the scope of the invention is restricted only within the meaning of the appended claims and the equivalents thereof.

What is claimed is:

1. An apparatus comprising:
a wafer holding device configured to hold a wafer in a beam path of a microlithographic projection exposure apparatus, wherein the wafer holding device comprises:
a plurality of sensors; and
a first positioning arrangement configured to rotate each of the plurality of sensors in mutually differing rotational positions of the beam path independently from the wafer and from each other; and
a mask holding device configured to hold a mask of the microlithographic projection exposure apparatus, wherein the mask holding device comprises:
at least one measurement mask comprising at least one measuring structure; and
a second positioning arrangement configured to position the at least one measurement mask in different rotational positions in an object plane of the microlithographic projection exposure apparatus.

2. The apparatus as claimed in claim 1, wherein the plurality of sensors comprises at least one line grating configured to measure distortion.

3. A wafer holding device configured to hold a wafer during operation of a microlithographic projection exposure apparatus, comprising:
a plurality of sensors and
a positioning arrangement configured to rotate each of the plurality of sensors in different rotational positions independently from the wafer and from each other,
wherein the plurality of sensors comprises at least one two-dimensional shearing grating configured to measure wavefront.

4. The apparatus as claimed in claim 1, wherein the plurality of sensors comprises at least one ptychography mask.

5. The apparatus as claimed in claim 1, wherein the plurality of sensors comprises at least one areally measuring intensity detector.

6. A microlithographic projection exposure apparatus comprising an illumination device and a projection lens,
wherein the illumination device illuminates a mask during operation of the microlithographic projection exposure apparatus, wherein the mask comprises structures to be imaged and wherein the mask is disposed in an object plane of the projection lens;
wherein the projection lens images the object plane onto an image plane; and
wherein the projection exposure apparatus comprises a wafer holding device and a mask holding device as claimed in claim 1.

7. The microlithographic projection exposure apparatus as claimed in claim 6, wherein the first positioning arrangement comprises a rotary stage that is configured to translationally displace in the image plane to position the at least one sensor in different rotational positions in the beam path of the projection exposure apparatus.

8. The microlithographic projection exposure apparatus as claimed in claim 6, wherein the second positioning arrangement comprises a further rotary stage that is configured to translationally displace in the object plane.

9. The microlithographic projection exposure apparatus as claimed in claim 8, wherein the further rotary stage is disposed on the mask holding device.

10. The microlithographic projection exposure apparatus as claimed in claim 8, wherein the further rotary stage is arranged on a holding device that is configured to displace translationally and that is separate from the mask holding device.

11. The microlithographic projection exposure apparatus as claimed in claim 8, wherein the at least one measurement mask comprises at least one line grating configured to measure distortion.

12. The microlithographic projection exposure apparatus as claimed in claim 8, wherein the at least one measurement mask comprises at least one two-dimensional shearing grating configured to measure wavefront.

13. The microlithographic projection exposure apparatus as claimed in claim 8, wherein the at least one measurement mask comprises at least one ptychography pinhole.

14. The microlithographic projection exposure apparatus as claimed in claim 6, wherein the projection lens is an anamorphic imaging system.

15. The wafer holding device as claimed in claim 3, wherein the positioning arrangement is further configured to position at least one ptychography mask.

16. The wafer holding device as claimed in claim 3, wherein the positioning arrangement is further configured to position at least one areally measuring intensity detector.

\* \* \* \* \*